(12) United States Patent
Wei

(10) Patent No.: US 7,934,539 B2
(45) Date of Patent: May 3, 2011

(54) ELECTRONIC APPARATUS AND COOLING MODULE

(75) Inventor: Jie Wei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1086 days.

(21) Appl. No.: 11/342,970

(22) Filed: Jan. 31, 2006

(65) Prior Publication Data

US 2007/0089859 A1    Apr. 26, 2007

(30) Foreign Application Priority Data

Oct. 24, 2005   (JP) .................................. 2005-308713

(51) Int. Cl.
*F28F 7/00* (2006.01)
(52) U.S. Cl. .................... 165/80.2; 165/200; 165/104.33
(58) Field of Classification Search .................. 165/80.1, 165/80.2, 80.3, 80.4, 80.5, 104.33; 361/690, 361/695, 699
See application file for complete search history.

(56) References Cited

U.S. PATENT DOCUMENTS

| | | | |
|---|---|---|---|
| 5,198,889 A | | 3/1993 | Hisano et al. |
| 5,285,347 A | * | 2/1994 | Fox et al. ...................... 165/80.4 |
| 6,263,957 B1 | * | 7/2001 | Chen et al. .................... 165/80.4 |
| 6,404,640 B1 | * | 6/2002 | Ishimine et al. ............. 361/699 |
| 6,621,707 B2 | * | 9/2003 | Ishimine et al. ............. 361/695 |
| 6,925,829 B2 | * | 8/2005 | Wei .......................... 165/104.33 |
| 6,970,355 B2 | * | 11/2005 | Ellsworth et al. ............. 361/695 |
| 7,012,807 B2 | * | 3/2006 | Chu et al. .................. 165/104.33 |
| 7,021,367 B2 | | 4/2006 | Oikawa |
| 7,055,341 B2 | * | 6/2006 | Nori et al. ..................... 165/80.4 |
| 7,151,667 B2 | * | 12/2006 | Walters et al. ................ 361/699 |
| 7,222,661 B2 | * | 5/2007 | Wei et al. ..................... 165/80.4 |
| 7,249,718 B2 | * | 7/2007 | Beitelmal et al. ............. 361/690 |
| 7,339,789 B2 | * | 3/2008 | Walters et al. ................ 361/699 |
| 2006/0021737 A1 | * | 2/2006 | Lee et al. ..................... 165/80.4 |

FOREIGN PATENT DOCUMENTS

| | | |
|---|---|---|
| JP | 1-115294 U | 8/1989 |
| JP | 3-48237 U | 5/1991 |
| JP | 4-242963 A | 8/1992 |
| JP | 8-32262 | 2/1996 |
| JP | 2002-151638 | 5/2002 |
| JP | 2003-50645 | 2/2003 |
| JP | 2005-116815 A | 4/2005 |
| JP | 2005-175075 A | 6/2005 |

OTHER PUBLICATIONS

"Japanese Office Action", mailed by JPO and corresponding to Japanese application No. 2005-308713 on Jun. 29, 2010, with English translation.

* cited by examiner

*Primary Examiner* — Ljiljana (Lil) V Ciric
(74) *Attorney, Agent, or Firm* — Fujitsu Patent Center

(57) ABSTRACT

A thermal conductive member is mounted on a heat generating object. An air cooling member is attached to the thermal conductive member for radiating heat into air. A liquid cooling member is removably attached to the thermal conductive member for absorbing heat from the thermal conductive member. The circulation pump operates to allow the flow of the coolant into the flow passage of the liquid cooling member. In this case, the thermal energy of the heat generating object is transferred to the air cooling member through the thermal conductive member. The heat radiating member serves to radiate the thermal energy into the air from a larger surface area. The heat generating object can in this manner be cooled down even without the liquid cooling member.

2 Claims, 8 Drawing Sheets

ELECTRONIC APPARATUS AND COOLING MODULE

BACKGROUND OF THE INVENTION

1. Field of the Invention

The present invention relates to a cooling module mounted on a heat generating object mounted on a printed wiring board for cooling the heat generating object.

2. Description of the Prior Art

A cooling module is well known, as disclosed in Japanese Patent Application Publication No. 2003-50645, for example. The cooling module is mounted on a central processing unit (CPU). The cooling module includes a thermal conductive plate and radiation fins integral to the thermal conductive plate. A flow passage is defined in the thermal conductive plate. A coolant circulates through the flow passage so as to absorb the thermal energy of the CPU. The radiation fins simultaneously serves to radiate the thermal energy of the CPU into the air.

The cooling module is often incorporated in a server computer, for example. The CPU of the server computer is expected to keep operating without cease. Replacement of the aforementioned thermal conductive plate, however, is frequently required. The replacement should require removal of the radiation fins along with the thermal conductive plate. The CPU tends to suffer from an inevitable rise in the temperature during the replacement of the thermal conductive plate. Redundancy of the cooling module thus cannot be obtained.

SUMMARY OF THE INVENTION

It is accordingly an object of the present invention to provide a cooling module providing a reliable redundancy in an electronic apparatus.

According to the present invention, there is provided an electronic apparatus comprising: a thermal conductive member mounted on a heat generating object mounted on a substrate, said thermal conductive member having heat conductivity; an air cooling member attached to the thermal conductive member for radiating heat into air; a liquid cooling member removably attached to the thermal conductive member for absorbing heat from the thermal conductive member, said liquid cooling member defining a flow passage; and a circulation pump coupled to the liquid cooling member so as to enable circulation of a coolant through the flow passage.

The liquid cooling member is attached to the thermal conductive member in the electronic apparatus. The circulation pump operates to allow the flow of the coolant into the flow passage of the liquid cooling member. The thermal energy of the heat generating object is transferred to the liquid cooling member through the thermal conductive member. The thermal energy is transferred to the coolant within the flow passage. This results in a rise in the temperature of the coolant. The heat generating object can in this manner be cooled down.

The liquid cooling member is removably attached to the thermal conductive member. Replacement of the liquid cooling member can be completed in a facilitated manner. In this case, the thermal energy of the heat generating object is transferred to the air cooling member through the thermal conductive member. The heat radiating member serves to radiate the thermal energy into the air from a larger surface area. The heat generating object can in this manner be cooled down even without the liquid cooling member. The electronic apparatus thus provides redundancy.

The electronic apparatus may further comprise: a heat exchanger defining a flow passage coupled to the flow passage of the liquid cooling member; a first ventilator generating airflow toward the heat exchanger, said airflow having a first flow rate; and a second ventilator generating airflow toward the air cooling member, said airflow having a second flow rate larger than the first flow rate.

The coolant is supplied to the flow passage of the heat exchanger from the flow passage of the liquid cooling member. The airflow of the first flow rate is supplied to the heat exchanger from the first ventilator. The thermal energy of the coolant can in this manner be radiated into the air from the heat exchanger. On the other hand, the air cooling member is designed to receive airflow of the second flow rate larger than the first flow rate from the second ventilator. The air cooling member of a reduced size is allowed to sufficiently cool down the heat generating member. The air cooling member only occupies a reduced space inside the electronic apparatus.

The electronic apparatus may further comprise a controlling circuit connected to the circulation pump and the first and second ventilators. The controlling circuit may be designed to suspend the first ventilator and activate the second ventilator in response to reception of a signal specifying a failure or malfunction of the circulation pump.

The first ventilator operates while the circulation pump is in operation. The first ventilator generates airflow at the first flow rate smaller than the second flow rate. In this case, the second ventilator is suspended. Sound of blow or operation of the second ventilator can thus be suppressed. When the circulation pump malfunctions, the coolant stops flowing in the flow passage of the liquid cooling member. The first ventilator stops operating. The second ventilator starts to generate airflow at the second flow rate larger than the first flow rate. The air cooling member performs well so as to sufficiently cool the heat generating object.

The electronic apparatus may further comprise: a first nipple formed in the circulation pump, said first nipple defining an inlet of the circulation pump; a first elastic pipe coupled to the first nipple; a second nipple formed in the circulation pump, said second nipple defining an outlet of the circulation pump; and a second elastic pipe coupled to the second nipple.

The liquid cooling member is removably attached to the thermal conductive member as described above. The first and second elastic pipes are employed to connect the circulation pump and the liquid cooling member to each other. The first and second elastic pipes are coupled to the first and second nipples respectively. A circulation channel is in this manner sealed between the circulation pump and the liquid cooling member. The electronic apparatus is allowed to omit an expensive joint such as a coupler in the circulation channel. Even when the circulation pump and the liquid cooling member are together replaced in the electronic apparatus, for example, leakage of the coolant can be prevented based on the performance of the first and second elastic pipes and the first and second nipples. The production cost of the electronic apparatus can be suppressed. The pressure loss can also be suppressed in the circulation channel of the coolant. The circulation of the coolant can be realized through the circulation channel in an efficient manner.

A cooling module may be provided to realize the electronic apparatus of the type. The cooling module may comprise: a thermal conductive member having heat conductivity; an air cooling member attached to the thermal conductive member; a liquid cooling member removably attached to the air cooling member, said liquid cooling member defining a flow passage; and a circulation pump coupled to the liquid cooling member so as to enable circulation of a coolant through the flow passage of the liquid cooling member.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
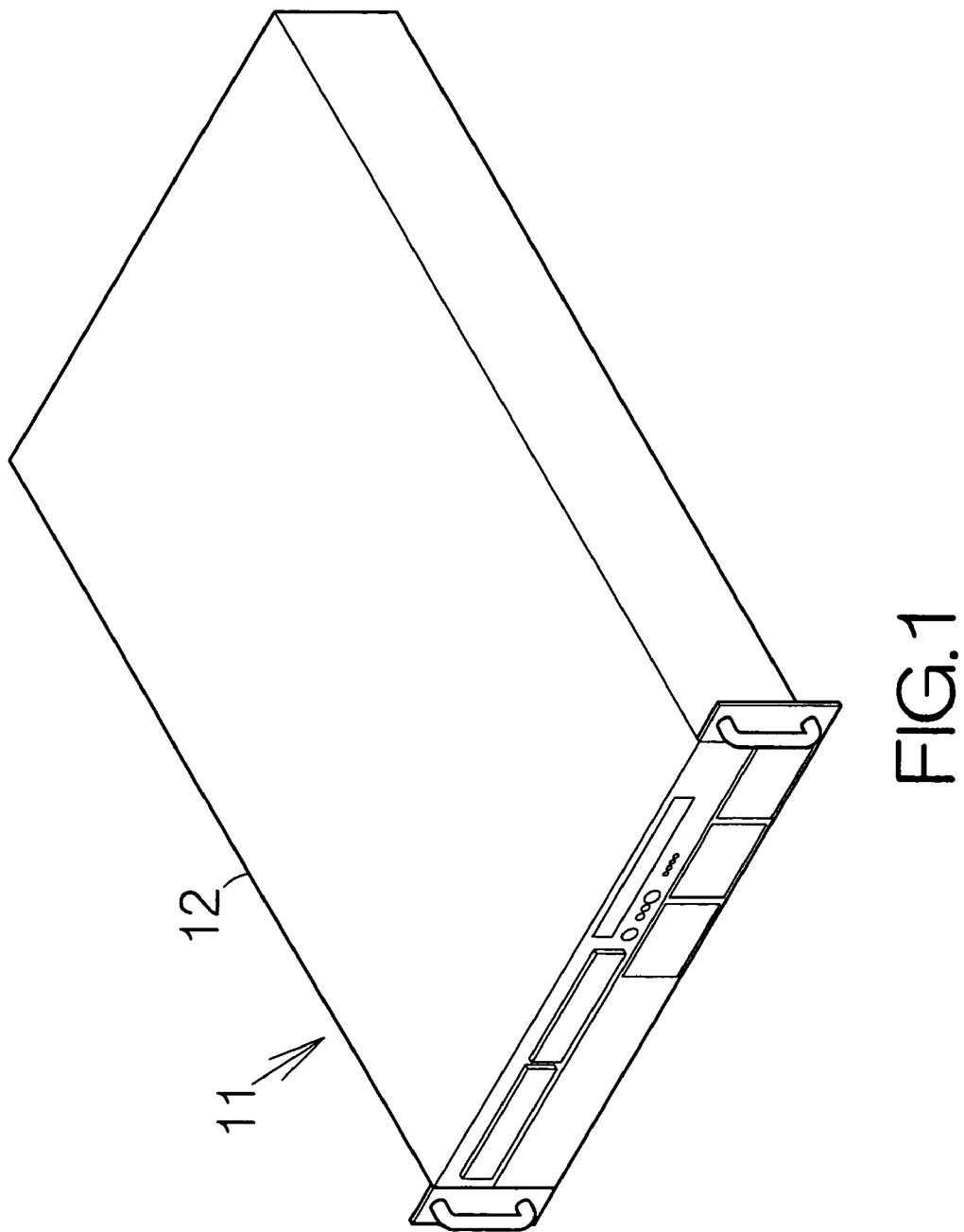
FIG. 1 is a perspective view schematically illustrating a server computer as an example of an electronic apparatus according to the present invention.

FIG. 1 schematically illustrates a server computer 11 as an example of an electronic apparatus according to a specific example of the present invention. The server computer 11 is mounted on a rack, for example. The server computer 11 includes an enclosure 12 defining an inner space to accommodate a substrate such as a main board.

Figure 2:
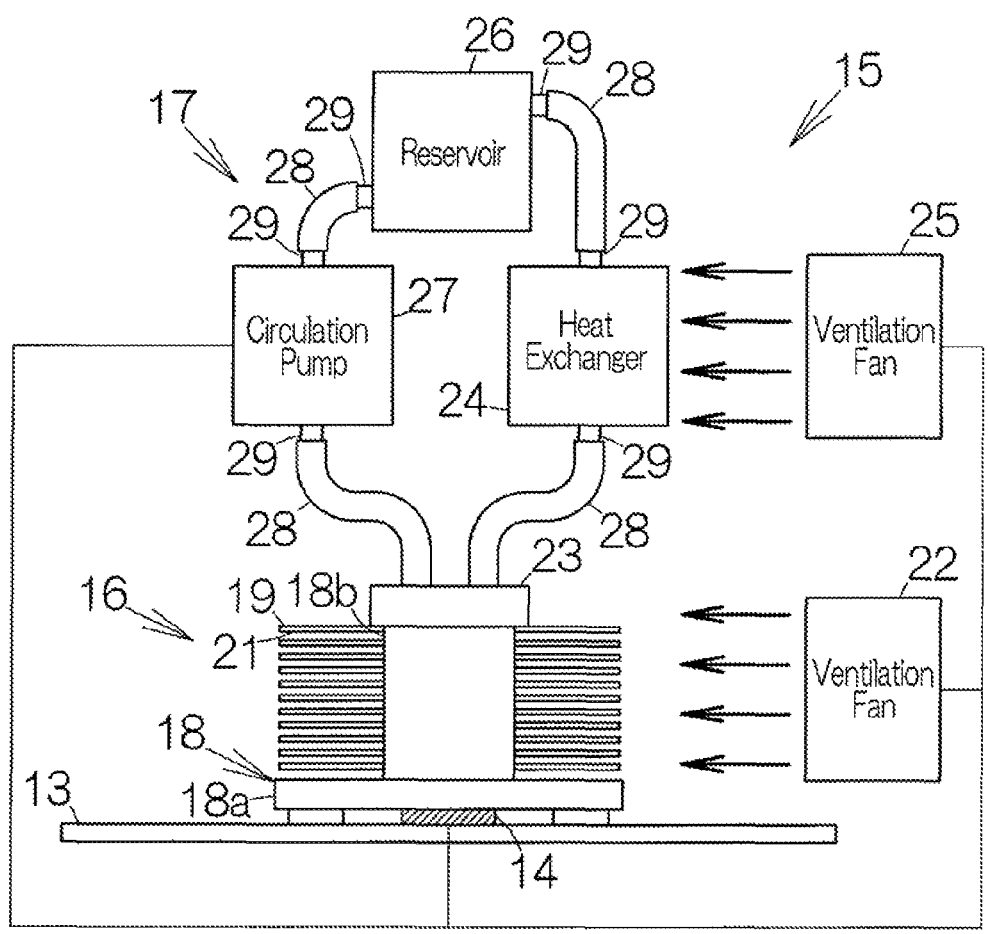
FIG. 2 is a diagram schematically illustrating the structure of a cooling module.

As shown in FIG. 2, a central processing unit (CPU) 14 is mounted on the main board 13. An electronic circuit element such as a memory, not shown, is also mounted on the main board 13. The CPU 14 is allowed to operate based on software programs or data temporarily stored in the memory.

The server computer 11 includes a cooling module 15 placed within the inner space of the enclosure 12. The cooling module 15 includes an air cooling unit 16 and a liquid cooling unit 17. The air cooling unit 16 is mounted on the CPU 14. The liquid cooling unit 17 is removably attached to the air cooling unit 16. Both the air cooling unit 16 and the liquid cooling unit 17 are placed within the inner space of the enclosure 12.

The air cooling unit 16 includes a thermal conductive member 18 mounted on the CPU 14. The thermal conductive member 18 includes a flat thermal conductive plate 18a and a cylindrical heat pipe 18b, for example. The thermal conductive plate 18a is received on the upper surface of the CPU 14. The heat pipe 18b stands from the upper surface of the thermal conductive plate 18a. The thermal conductive plate 18a is designed to extend over an area larger or wider than the upper surface of the CPU 14 on the main board 13.

The air cooling unit 16 also includes radiation fins 19 as an air cooling member. The radiation fins 19 are designed to extend from the heat pipe 18b in parallel with the upper surface of the thermal conductive plate 18a, for example. Airflow passages 21 are defined between the adjacent radiation fins 19. The airflow passages 21 are designed to extend in an identical direction. The thermal conductive plate 18a, the heat pipe 18b and the radiation fins 19 may be made of a metal material having heat conductivity such as aluminum or copper. The thermal conductive plate 18a, the heat pipe 18b and the radiation fins 19 may be formed into a one-piece component. In this case, the thermal conductive plate 18a, the heat pipe 18b and the radiation fins 19 constitute a so-called heat sink.

A ventilator or ventilation fan 22 is opposed to the radiation fins 19. Heat generated in the CPU 14 is transferred to the radiation fins 19 through the thermal conductive plate 18a and the heat pipe 18b. When the ventilation fan 22 is driven to rotate, airflow is generated along the airflow passages 21. The airflow serves to radiate the heat of the radiation fins 19 into the air.

The ventilation fan 22 is connected to the CPU 14. The CPU 14 supplies a control signal to the ventilation fan 22. The ventilation fan 22 is controlled to operate and stop based on the supplied control signal. The control signal is also utilized to control the flow rate of the airflow supplied to the radiation fins 19 from the ventilation fan 22.

The liquid cooling unit 17 includes a plate-shaped liquid cooling jacket 23 as a liquid cooling member, for example. The liquid cooling jacket 23 is removably attached to the thermal conductive member 18. The bottom of the liquid cooling jacket 23 is received on the top or upper surface of the heat pipe 18b, for example. The liquid cooling jacket 23 may be made of a metal material having heat conductivity such as aluminum or copper.

A flow passage, not shown, is defined within the liquid cooling jacket 23 for the flow of a coolant or refrigerant. The flow passage is designed to serpentine between an inflow opening and an outflow opening defined in the liquid cooling jacket 23. The flow passage is formed along the bottom of the liquid cooling jacket 23. This structure enables a coolant within the flow passage to contact with the bottom of the liquid cooling jacket 23 over a larger or wider area. An antifreeze may be employed as a coolant, for example. Alternatively, parallel flow passages may be employed to connect the inflow and outflow openings to each other within the liquid cooling jacket 23.

The liquid cooling unit 17 also includes a heat exchanger 24 connected to the liquid cooling jacket 23. The heated coolant is supplied to the heat exchanger 24 from the liquid cooling jacket 23. The heat exchanger 24 includes a flow tube, not shown, serpentine within the heat exchanger 24. The flow tube provides a flow passage for a coolant. Fins are attached to the flow tube. The flow tube may be made of a metal material having heat conductivity such as aluminum or copper. Alternatively, parallel flow tubes may be employed as the flow passages for a coolant within the heat exchanger 24.

A ventilator or ventilation fan 25 is opposed to the heat exchanger 24. The heated coolant is supplied to the flow tube of the heat exchanger 24 from the flow passage of the liquid cooling jacket 23 as described above. When the ventilation fan 25 is driven to rotate, airflow is generated along the flow tube of the heat exchanger 24. The airflow serves to radiate the heat of the coolant circulating through the flow passage within the flow tube into the air.

The ventilation fan 25 is also connected to the CPU 14. The ventilation fan 25 is controlled to operate and stop based on the supplied control signal. The control signal is also utilized to control the flow rate of the airflow supplied to the heat exchanger 24 from the ventilation fan 25.

The liquid cooling unit 17 also includes a reservoir 26 connected to the heat exchanger 24. The coolant flows into the reservoir 26 from the flow tube of the heat exchanger 24. The coolant can be stored in the reservoir 26.

The liquid cooling unit 17 also includes a circulation pump 27 connected to the reservoir 26. The circulation pump 27 is also connected to the liquid cooling jacket 23. The circulation pump 27 is allowed to suck the coolant from the reservoir 26 and discharge the coolant into the flow passage of the liquid cooling jacket 23.

The circulation pump 27 is connected to the CPU 14. The CPU 14 supplies a control signal to the circulation pump 27. The control signal is utilized to control the flow rate of the coolant. The circulation pump 27 is designed to supply to the CPU 14 an alert signal specifying a failure or malfunction of the circulation pump 27. The CPU 14 is allowed to detect a failure or malfunction of the circulation pump 27 in response to reception of the alert signal. A sensor, not shown, may be incorporated in the circulation pump 27 for supplying the alert signal to the CPU 14. The sensor is capable of detecting a failure or malfunction of the circulation pump 27.

As shown in FIG. 2, a single elastic pipe or hose 28 is employed for each connection between the liquid cooling jacket 23 and the heat exchanger 24, between the heat exchanger 24 and the reservoir 26, between the reservoir 26 and the circulation pump 27, and between the circulation pump 27 and the liquid cooling jacket 23. The hoses 28 may be made of an elastic resin material having flexibility such as rubber.

A pair of nipples 29 may be formed integral to each of the liquid cooling jacket 23, the heat exchanger 24, the reservoir 26 and the circulation pump 27. The ends of the hoses 28 are coupled to the nipples 29. For example, one of the nipples 29 defines an inlet of the circulation pump 27 while the other defines an outlet of the circulation pump 27. A holder such as a hose clamp, a hose clip and a hose band, not shown, may be utilized to tightly couple the hoses 28 to the corresponding nipples 29, for example.

The hoses 28 and the nipples 29 serve to establish a circulation channel passing through the circulation pump 27, the liquid cooling jacket 23, the heat exchanger 24 and the reservoir 26. The circulation channel is sealed so that the circulation channel is separated from the air. A coolant is allowed to circulate within the circulation channel with the assistance of the circulation pump 27.

Figure 3:
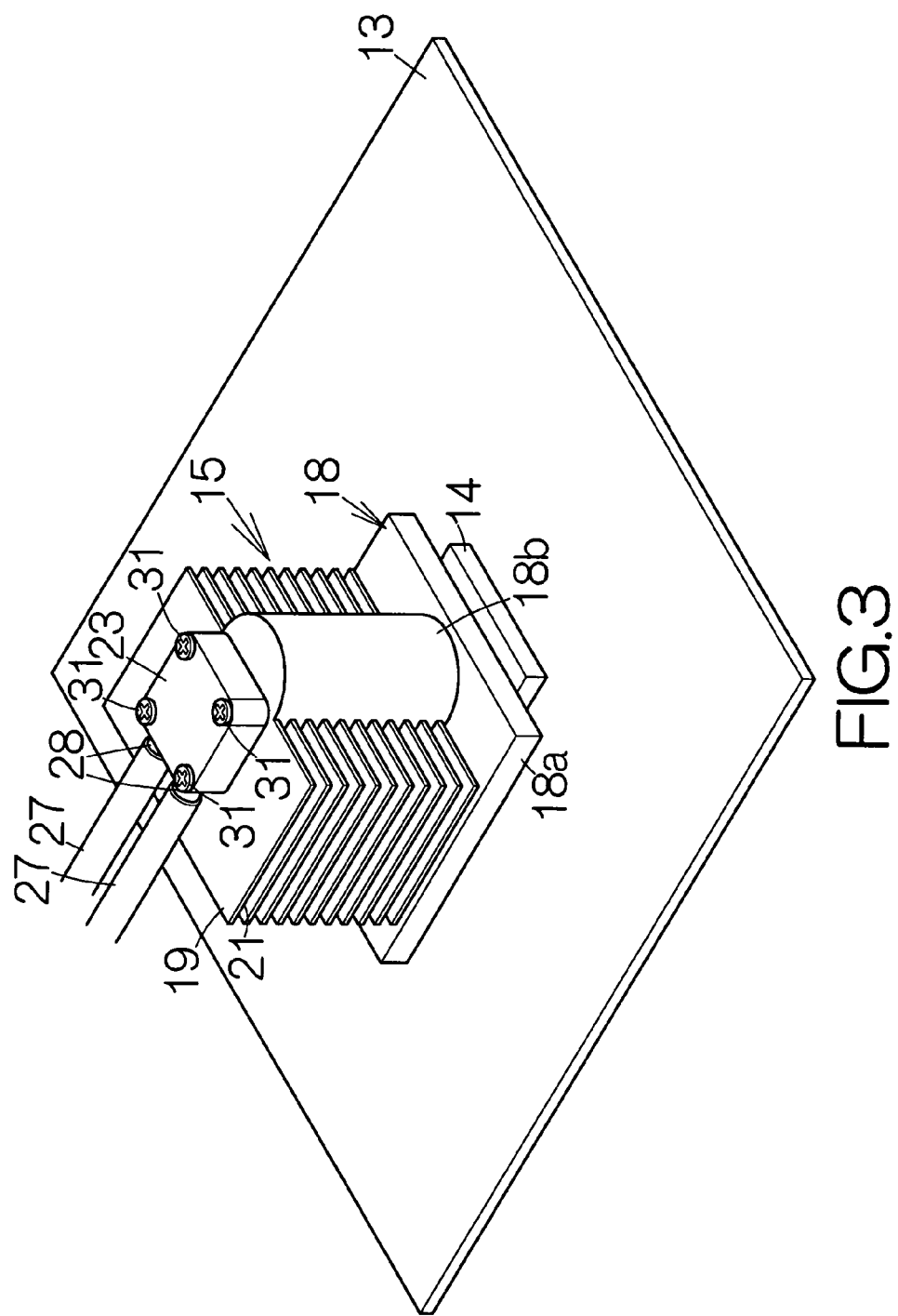
FIG. 3 is a perspective view schematically illustrating an air cooling unit and a liquid cooling unit of the cooling module.

As shown in FIG. 3, screws 31, 31, . . . , four of them in this case, may be employed for attachment of the liquid cooling jacket 23 on the heat pipe 18b. Screw bores, not shown, may be formed in the heat pipe 18b and the uppermost one of the radiation fins 19. The liquid cooling jacket 23 can thus be removed from and attached to the heat pipe 18b in a facilitated manner.

Figure 4:
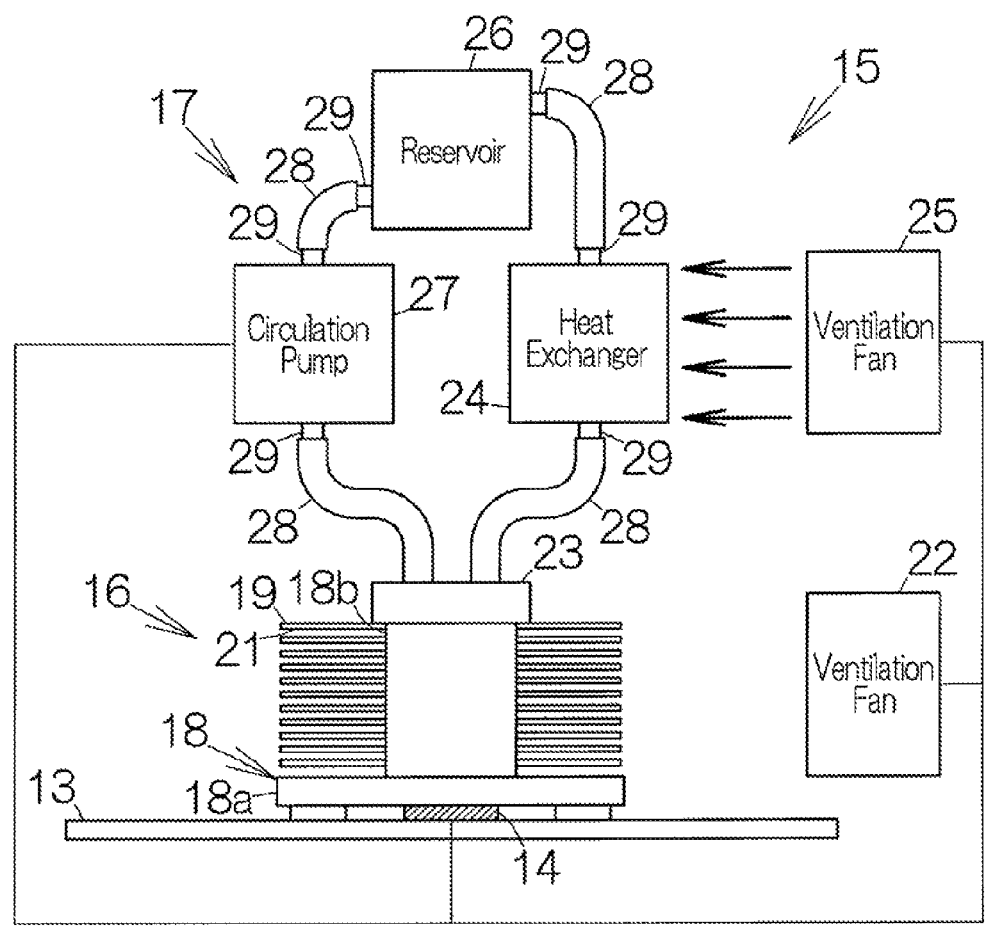
FIG. 4 is a diagram schematically illustrating the cooling module during the normal operation.

As shown in FIG. 4, the CPU 14 activates only the ventilation fan 25 during a normal operation of the server computer 11. The ventilation fan 25 is set to provide airflow at a first flow rate of a relatively low level. The airflow is directed to the heat exchanger 24 from the ventilation fan 25.

The CPU 14 activates the circulation pump 27. The coolant is allowed to flow into the circulation pump 27 from the reservoir 26. The circulation pump 27 serves to generate the flow of the coolant toward the flow passage of the liquid cooling jacket 23. The coolant is in this manner allowed to flow through the flow passage of the liquid cooling jacket 23.

The CPU 14 generates heat during the operation. The thermal energy of the CPU 14 is transferred to the thermal conductive plate 18a. The thermal energy is then transferred to the liquid cooling jacket 23 from the thermal conductive plate 18a through the heat pipe 18b. The thermal energy of the CPU 14 is in this manner transferred to the coolant within the flow passage of the liquid cooling jacket 23. This results in a rise in the temperature of the coolant.

The heated coolant flows into the heat exchanger 24 from the liquid cooling jacket 23. The ventilation fan 25 serves to generate airflow along the flow tube of the heat exchanger 24, so that the thermal energy of the heated coolant is radiated into the air from the surface of the fins of the flow tube. The coolant is in this manner cooled down. The coolant is then supplied to the reservoir 26. The coolant circulates through the circulation channel.

Now, assume that the circulation pump 27 malfunctions. The coolant stops circulating through the circulation channel. The CPU 14 is allowed to detect a failure or malfunction of the circulation pump 27 based on an alert signal supplied from the sensor of the circulation pump 27.

Figure 5:
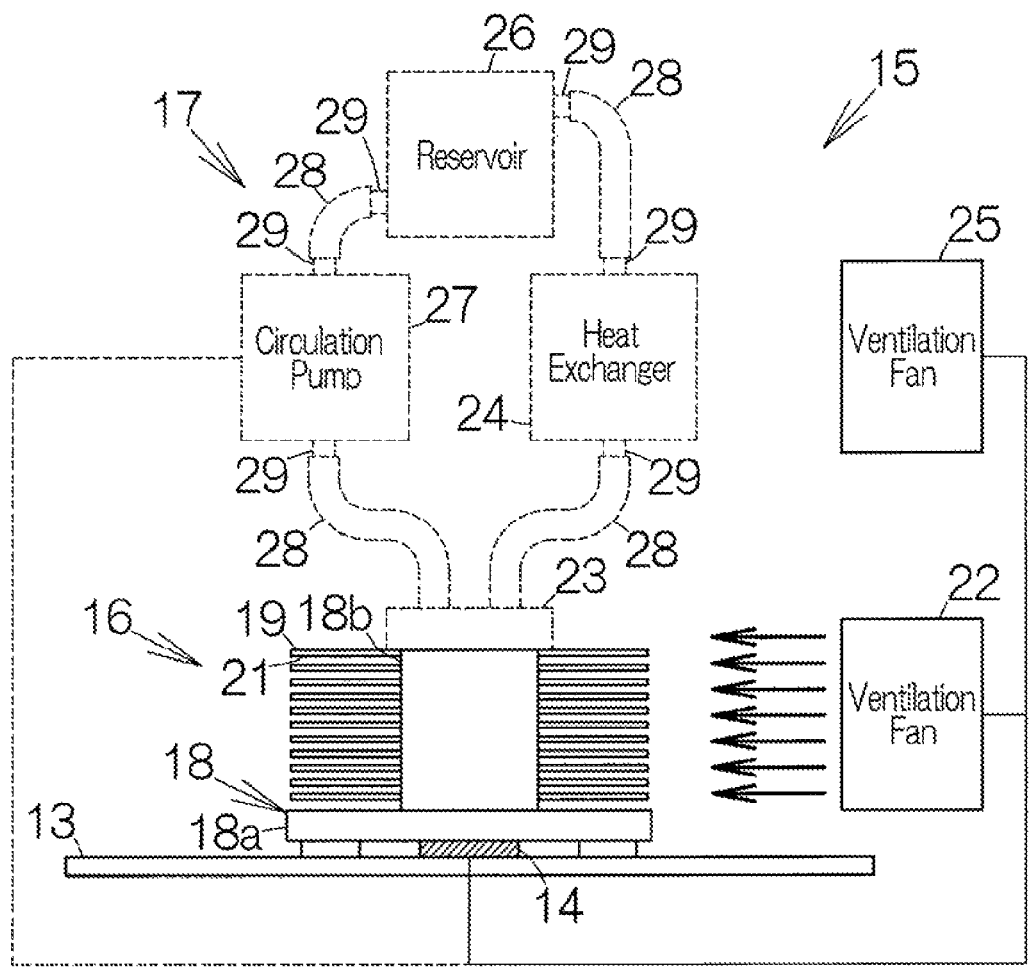
FIG. 5 is a diagram schematically illustrating the cooling module during the replacement of the liquid cooling unit.

As shown in FIG. 5, the CPU 14 suspends the ventilation fan 25 and activates ventilation fan 22. The ventilation fan 22 is set to provide airflow of a second flow rate larger than the aforementioned first flow rate. The second flow rate is set relatively high.

The liquid cooling jacket 23 is detached from the heat pipe 18b. The liquid cooling jacket 23 is then taken out of the enclosure 12 along with the heat exchanger 24, the reservoir 26 and the circulation pump 27. The liquid cooling unit 17 can in this manner be replaced with new one. The liquid cooling jacket 23 of a new liquid cooling unit 17 is attached to the heat pipe 18b.

The airflow of the second flow rate passes through the airflow passages 21 between the adjacent radiation fins 19 during the replacement of the liquid cooling unit 17. The ventilation fan 22 serves to efficiently radiate the thermal energy of the radiation fins 19 into the air. The CPU 14 can be cooled down sufficiently even without the liquid cooling unit 17.

The bottom of the liquid cooling jacket 23 is received on the upper surface of the heat pipe 18b in the server computer 11 as described above. The heat exchanger 24 serves to efficiently radiate the thermal energy of the CPU 14 into the air during the operation of the circulation pump 27. Even while the circulation pump 27 malfunctions, the thermal energy of the CPU 14 is efficiently radiated from the radiation fins 19 into the air. The CPU 14 is efficiently cooled down. The server computer 11 thus provides redundancy.

Moreover, the ventilation fan 25 is set to provide airflow at the first flow rate of a relatively low level during the operation of the circulation pump 27. The sound of blow or the rotating fan can be suppressed. On the other hand, the ventilation fan 22 is set to provide airflow at the second flow rate larger than the first flow rate when the circulation pump 27 malfunctions. The radiation fins 19 of a reduced size can be employed to sufficiently cool down the CPU 14. The radiation fins 19 only occupy a smaller space within the enclosure 12.

The liquid cooling jacket 23 is removably attached to the heat pipe 18b in the server computer 11 as described above. The hoses 28 and the nipples 29 reliably seal the circulation channel, so that a coolant is reliably prevented from leakage from the liquid cooling unit 17 during the replacement of the liquid cooling unit 17. The liquid cooling unit 17 can be replaced in an extremely facilitated manner. In addition, the liquid cooling unit 17 in its entirety is detached from the air cooling unit 16. The liquid cooling unit 17 is allowed to omit an expensive joint such as a coupler that is in general required to divide a circulation channel without leakage of a coolant. The production cost can be reduced for the liquid cooling unit 17. The pressure loss can also be suppressed at the connections in the circulation channel. The circulation of the coolant can thus be realized through the circulation channel in an efficient manner.

A conventional liquid cooling unit allows replacement of a circulation pump when the circulation pump happens to malfunction, for example. Couplers must be attached to hoses. The couplers allow separation of the circulation pump without leakage of a coolant in the circulation channel. Employment of the couplers, however, induces an increase in the production cost of the liquid cooling unit 17. The couplers lead to the pressure loss for the flow of a coolant in the circulation channel.

Figure 6:
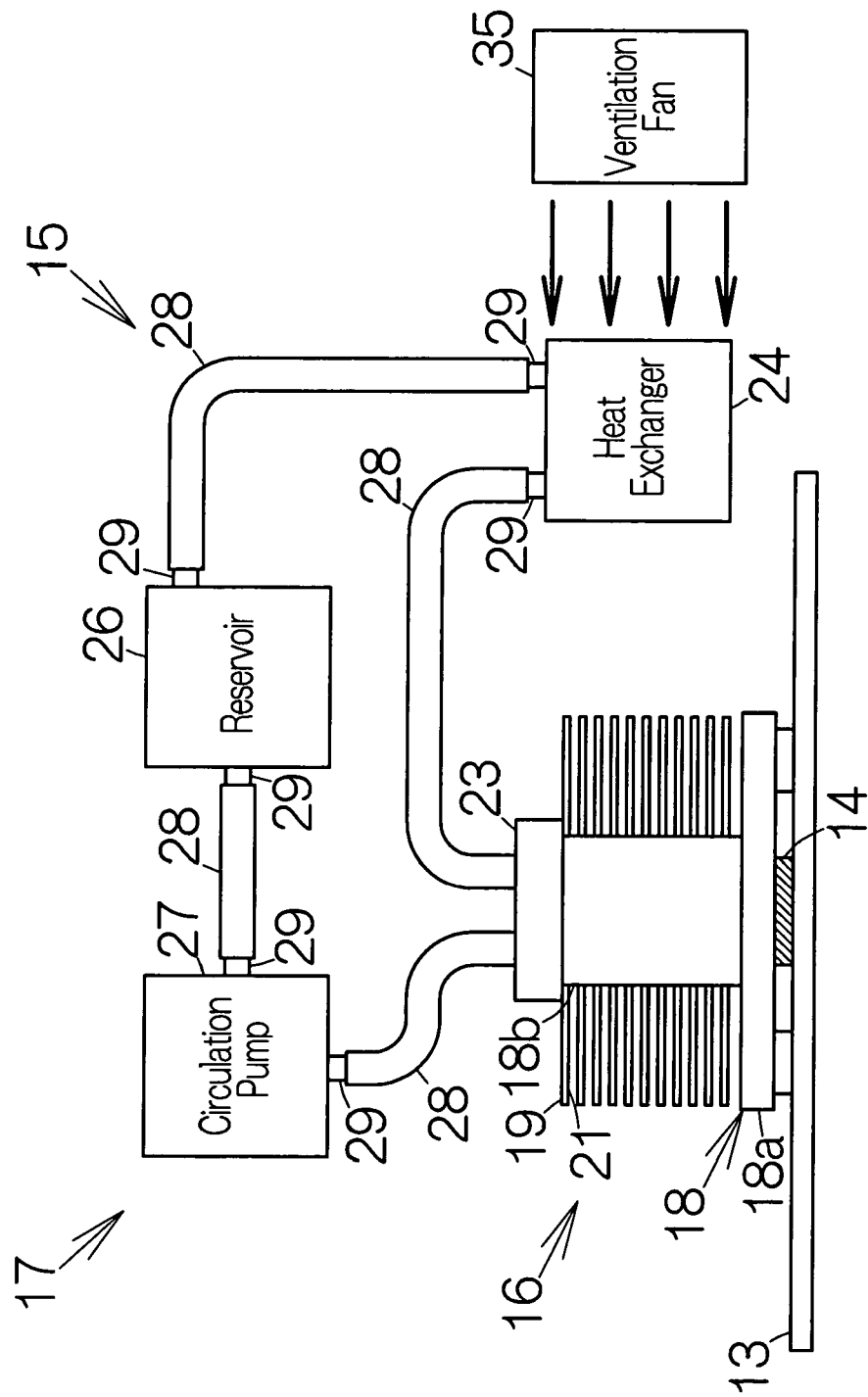
FIG. 6 is a diagram schematically illustrating the structure of a cooling module according to another specific example of the present invention.

As shown in FIG. 6, a single ventilation fan 35 may be employed in place of the aforementioned ventilation fans 22, 25. The ventilation fan 35 may be related to both the radiation fins 19 and the heat exchanger 24. The heat exchanger 24 may be placed in a space between the radiation fins 19 and the ventilation fan 35, for example. Like reference numerals are attached to the structure or components equivalent to those of the aforementioned embodiment.

The CPU 14 activates the circulation pump 27 during the normal operation of the server computer 11 as described above. The coolant can thus be circulated through the circulation channel. The CPU 14 simultaneously activates the ventilation fan 35. The ventilation fan 35 is set to provide airflow at the first flow rate of a relatively low level. The thermal energy of the CPU 14 can thus be radiated from the heat exchanger 24 into the air.

Figure 7:
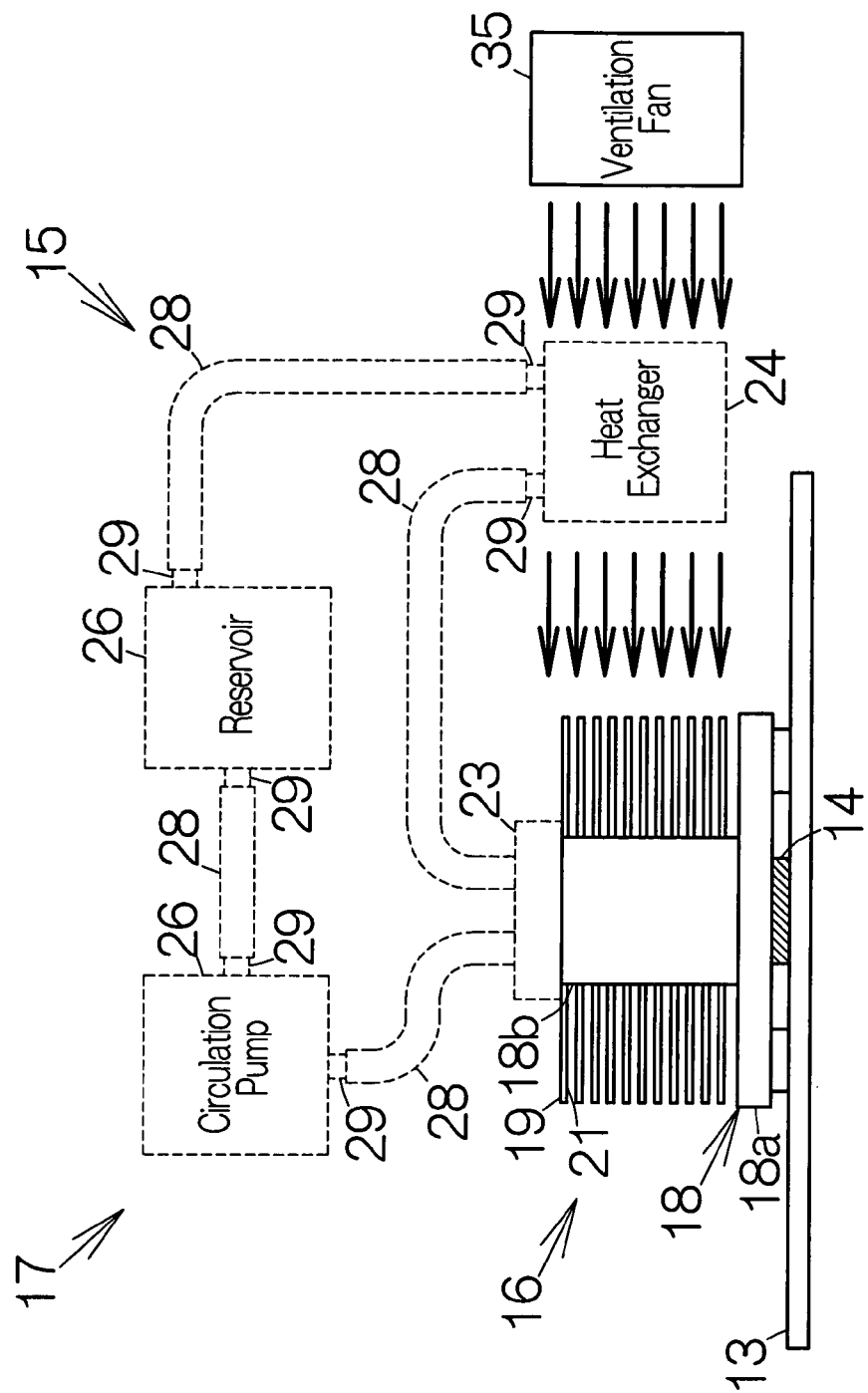
FIG. 7 is a diagram schematically illustrating the cooling module during the replacement of the liquid cooling unit.

The ventilation fan 35 is set to provide airflow at the second flow rate larger than the first flow rate based on the control of the CPU 14 during the replacement of the liquid cooling unit 17, as shown in FIG. 7. Since the heat exchanger 24 is removed from a space between the ventilation fan 35 and the radiation fins 19, the airflow passages 21 of the radiation fins 19 can be exposed to the airflow at the second flow rate of a relatively high level.

Since the ventilation fan 35 is set to provide airflow at the second flow rate larger than the first flow rate during the replacement of the liquid cooling unit 17, the thermal energy of the CPU 14 can efficiently be radiated from the radiation fins 19 into the air. The CPU 14 can sufficiently be cooled down due to the air cooling unit 16 without the assistance of the liquid cooling unit 17. The server computer 11 thus provides redundancy. The server computer 11 is also allowed to enjoy advantages identical to those achieved in the aforementioned embodiment.

Figure 8:
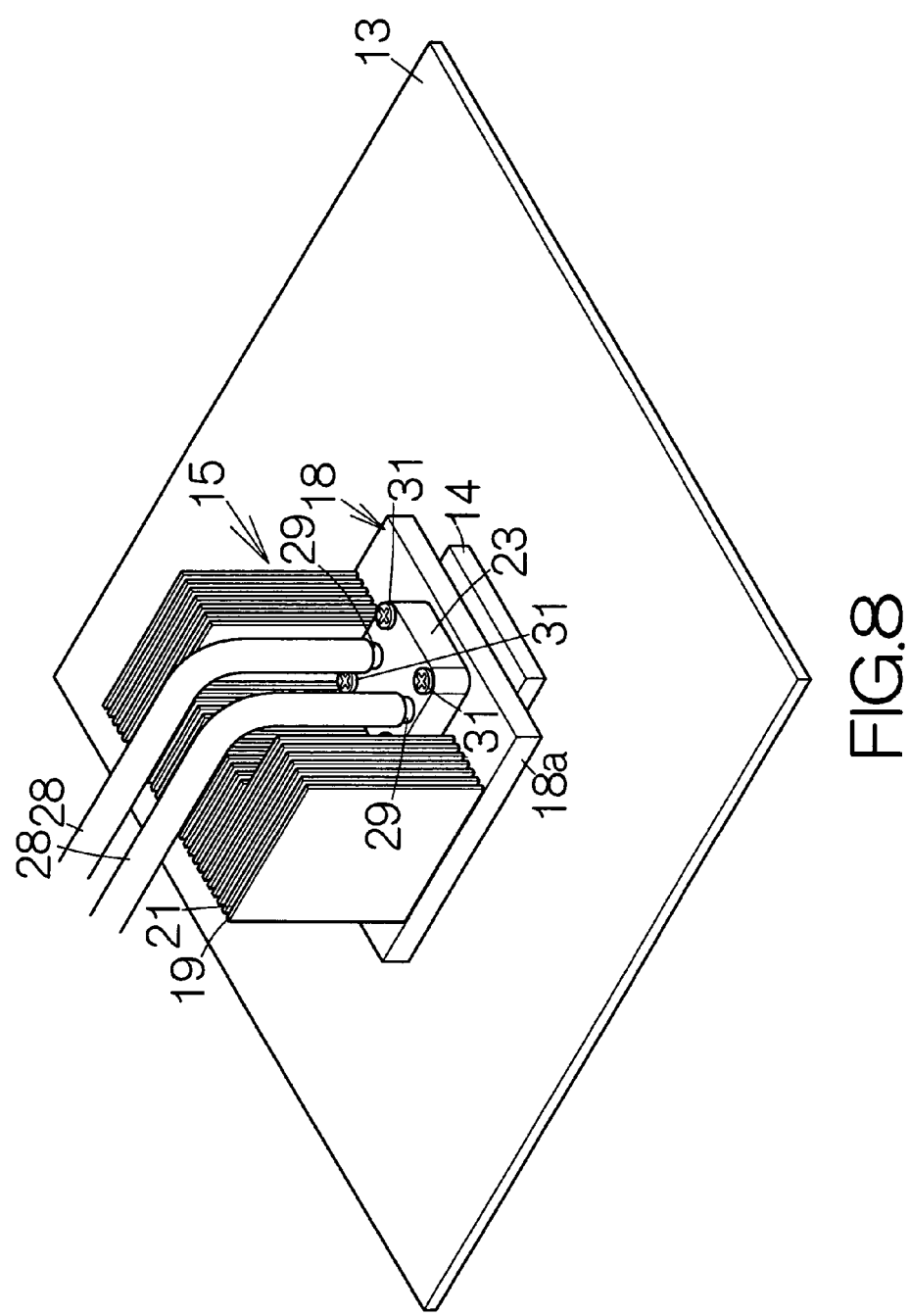
FIG. 8 is a perspective view schematically illustrating a cooling module according to still another specific example of the present invention.

As shown in FIG. 8, the heat pipe 18*b* may be omitted from the thermal conductive member 18. The radiation fins 19 may stand in a vertical direction from the upper surface of the thermal conductive member 18 or thermal conductive plate 18*a*. The bottom of the liquid cooling jacket 23 may directly received on the upper surface of the thermal conductive plate 18*a*. Four of the screws 31 may be employed for attachment of the liquid cooling jacket 23 in the same manner as described above, for example. The cooling module 15 of this type is allowed to enjoy advantages identical to those achieved in the aforementioned embodiment.

What is claimed is:

1. An electronic apparatus comprising:
    a thermal conductive member mounted on a heat generating object mounted on a substrate, the thermal conductive member having heat conductivity;
    radiation fins attached to the thermal conductive member for radiating heat into air;
    a liquid cooling member removably attached to the thermal conductive member for absorbing heat from the thermal conductive member, the liquid cooling member defining a flow passage;
    a circulation pump coupled to the liquid cooling member so as to enable circulation of a coolant through the flow passage;
    a heat exchanger defining a flow passage coupled to the flow passage of the liquid cooling member;
    a first ventilator generating airflow toward the heat exchanger, the airflow having a first flow rate;
    a second ventilator generating airflow toward the radiation fins, the airflow having a second flow rate larger than the first flow rate; and
    a controlling circuit connected to the circulation pump and the first and second ventilators, the controlling circuit suspending the first ventilator and activating the second ventilator in response to a reception of a signal specifying a failure of the circulation pump,
    wherein the flow passage is not defined in the thermal conductive member.

2. The electronic apparatus according to claim 1, further comprising:
    a first nipple formed on the circulation pump, the first nipple defining an inlet of the circulation pump;
    a first elastic pipe coupled to the first nipple;
    a second nipple formed on the circulation pump, the second nipple defining an outlet of the circulation pump; and
    a second elastic pipe coupled to the second nipple.

* * * * *